United States Patent [19]
Morishima et al.

[11] Patent Number: 5,734,281
[45] Date of Patent: Mar. 31, 1998

[54] SEMICONDUCTOR INTEGRATED CIRCUIT FOR OUTPUTTING AN INTERMEDIATE POTENTIAL

[75] Inventors: Chikayoshi Morishima; Shigeki Ohbayashi, both of Tokyo, Japan

[73] Assignee: Mitsubishi Denki Kabushiki Kaisha, Tokyo, Japan

[21] Appl. No.: 731,992

[22] Filed: Oct. 23, 1996

[30] Foreign Application Priority Data

Apr. 16, 1996 [JP] Japan ............... 8-094390

[51] Int. Cl.⁶ ............................................. H03K 17/22
[52] U.S. Cl. .................... 327/143; 327/198; 365/226; 365/227
[58] Field of Search ........................... 327/142, 143, 327/198, 538, 545; 365/226, 227

[56] References Cited

U.S. PATENT DOCUMENTS

| | | | |
|---|---|---|---|
| 4,717,840 | 1/1988 | Ouyang et al. | 327/143 |
| 5,039,875 | 8/1991 | Chang | 327/143 |
| 5,319,601 | 6/1994 | Kawata et al. | 327/143 |
| 5,523,710 | 6/1996 | Miyake et al. | 327/142 |
| 5,612,641 | 3/1997 | Sali | 327/143 |

FOREIGN PATENT DOCUMENTS 61-222318  10/1986  Japan.

*Primary Examiner*—Timothy P. Callahan
*Assistant Examiner*—Kenneth B. Wells
*Attorney, Agent, or Firm*—Oblon, Spivak, McClelland, Maier & Neustadt, P.C.

[57] ABSTRACT

A small-sized semiconductor integrated circuit is provided in which the potential of a predetermined node can be set to an intermediate potential in a short period after a power source is turned on. By using a power on reset signal which is inverted when a source potential is set to a predetermined intermediate potential, a P channel MOS transistor whose source directly receives the source potential supplies charges to the predetermined node at an early stage after the power source is turned on until the source potential reaches the intermediate potential.

8 Claims, 8 Drawing Sheets

SEMICONDUCTOR INTEGRATED CIRCUIT FOR OUTPUTTING AN INTERMEDIATE POTENTIAL

BACKGROUND OF THE INVENTION

1. Field of the Invention

The present invention relates to a semiconductor integrated circuit which operates by using two kinds of source potentials and an intermediate potential therebetween, and more particularly to a semiconductor integrated circuit in which an intermediate potential generating circuit for supplying the intermediate potential is provided.

2. Description of the Background Art

Figure 13:
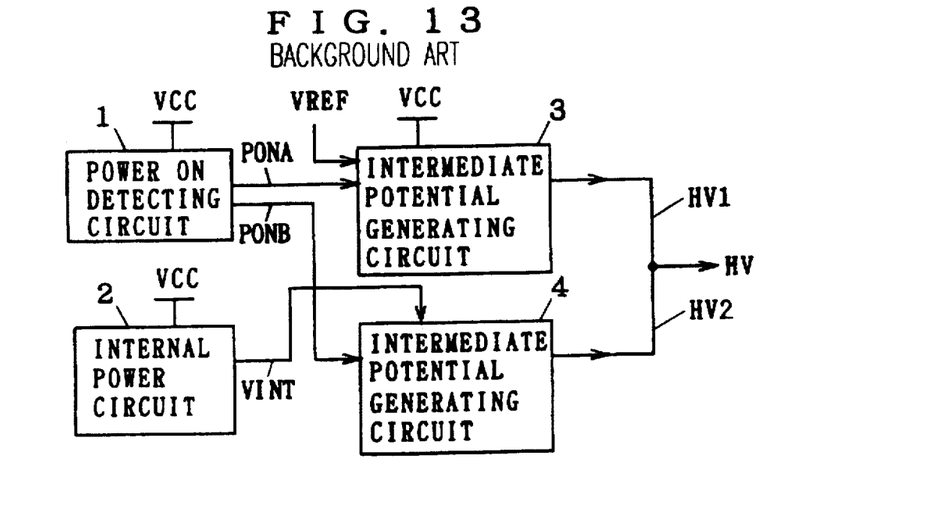
FIG. 13 is a block diagram showing an example of the structure of a semiconductor integrated circuit using an intermediate potential according to the prior art.

FIG. 13 is a block diagram showing the structure of intermediate potential generating circuits and peripheral circuits of a DRAM (dynamic random access memory) according to the prior art described in Japanese Patent Laying Open Gazette No. 5-120873. In FIG. 13, the reference numeral 1 designates a power on detecting circuit for detecting that an external power source is turned on and an external source potential VCC reaches a preset potential to generate detecting signals PONA and PONB, the reference numeral 2 designates an internal power circuit for generating an internal source potential VINT which is lower than the external source potential VCC on receipt of the external source potential VCC, the reference numeral 3 designates a first intermediate potential generating circuit having the greater intermediate potential driving ability to generate and supply a first intermediate potential HV1 to an intermediate potential supply contact on receipt of the external source potential VCC and a reference voltage $V_{REF}$, and to stop the function of supplying the first intermediate potential HV1 to the intermediate potential supply contact and to generate an intermediate potential when the detecting signal PONA is generated and the first intermediate potential HV1 reaches a predetermined potential, and the reference numeral 4 designates a second intermediate potential generating circuit for generating a second intermediate potential HV2 on receipt of the internal source potential VINT and for supplying the second intermediate potential HV2 to the intermediate potential supply contact with the intermediate potential driving ability which is smaller than that of the first intermediate potential generating circuit 3 when the detecting signal PONB is generated.

Figure 14:
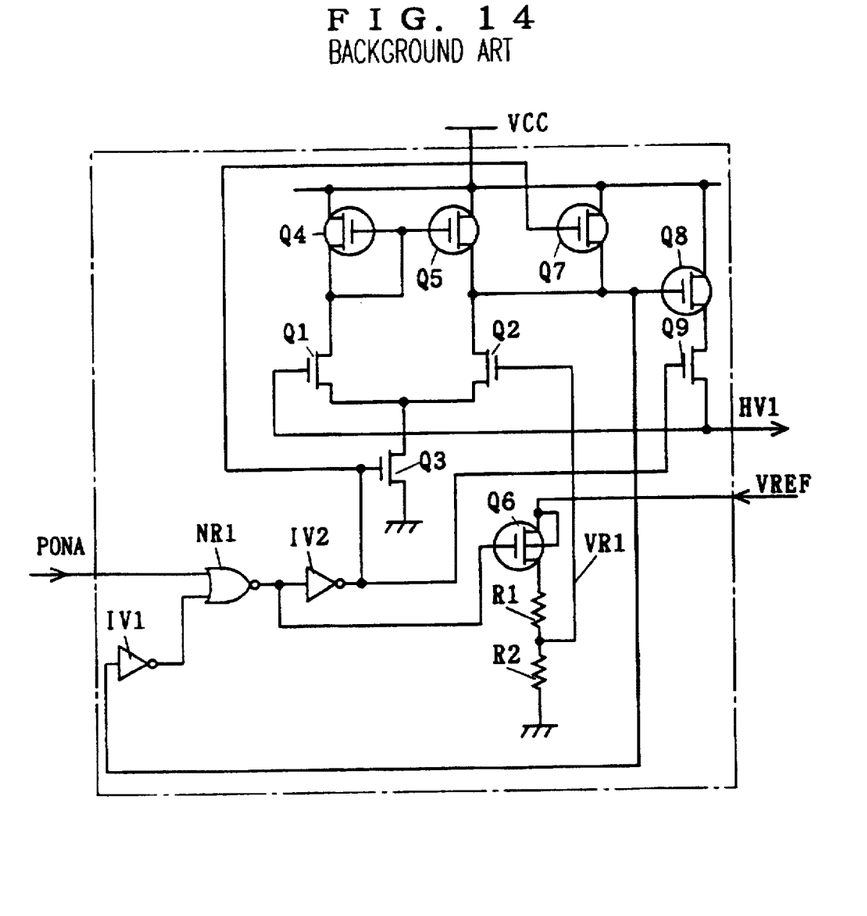
FIG. 14 is a circuit diagram showing the structure of an intermediate potential generating circuit having the greater driving ability shown in FIG. 13.
Figure 15:
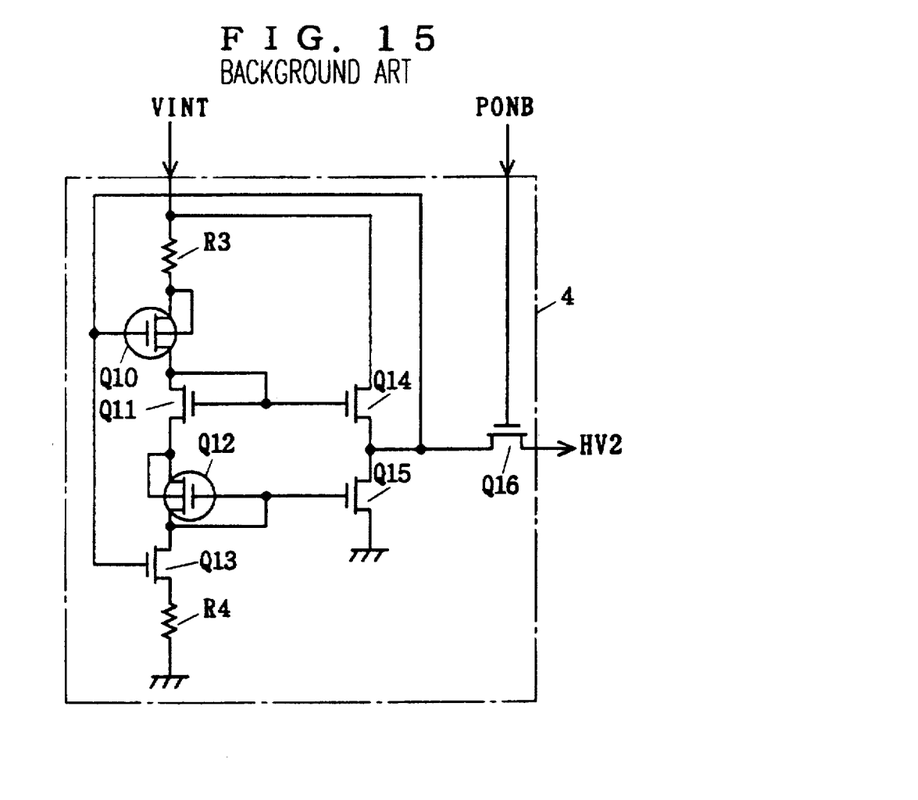
FIG. 15 is a circuit diagram showing the structure of an intermediate potential generating circuit having the smaller driving ability shown in FIG. 13.

FIG. 14 is a circuit diagram showing the structure of the first intermediate potential generating circuit 3 in FIG. 13 which has been described in Japanese Patent Laying Open Gazette No. 5-120873, for example. FIG. 15 is a circuit diagram showing the structure of the second intermediate potential generating circuit 4 of FIG. 13 which has been described in Japanese Patent Laying Open Gazette No. 5-120873, for example.

Figure 16:
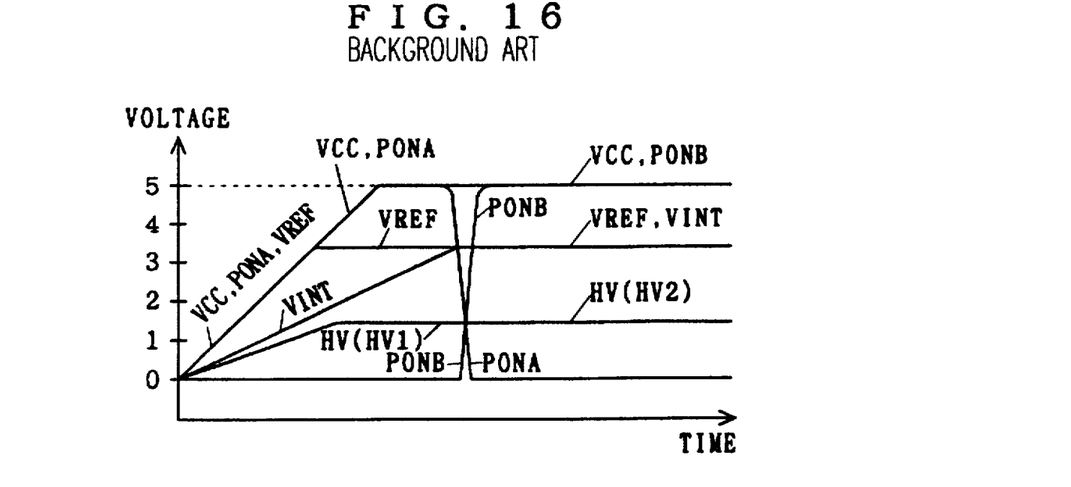
FIG. 16 is a waveform chart for explaining the operation of the semiconductor integrated circuit shown in FIG. 13.

FIG. 16 is a waveform chart for a signal of each portion for explaining the operation of the first and second intermediate potential generating circuits 3 and 4 shown in FIG. 13.

As shown in FIG. 16, the power on detecting circuit 1 detects that the external source potential VCC reaches 5 V, and generates the detecting signal PONA which is changed from the external source potential VCC to a ground potential, and the detecting signal PONB which is changed from the ground potential to the external source potential VCC.

Figure 17:
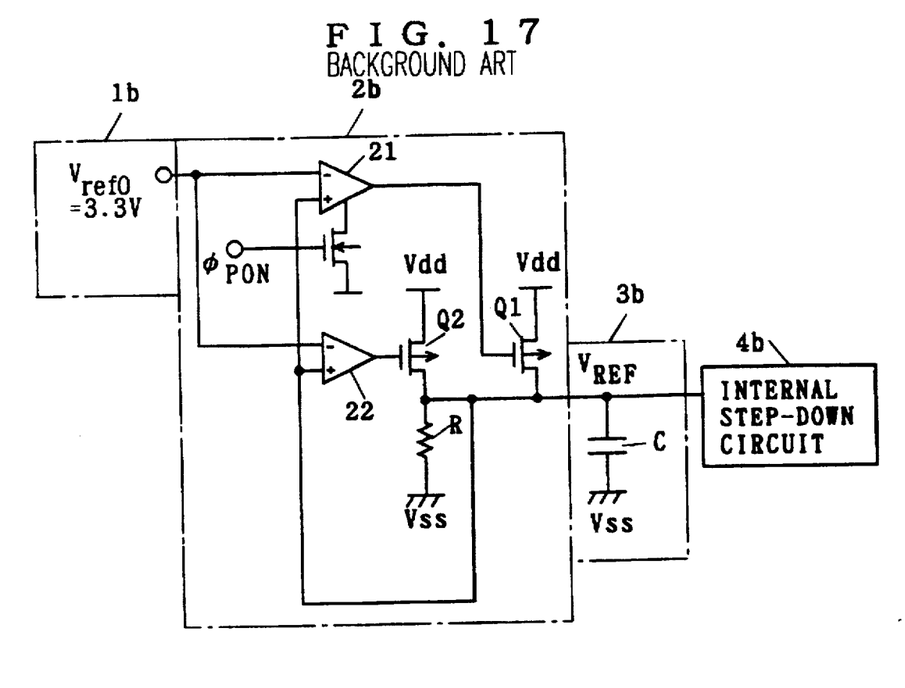
FIG. 17 is a block diagram showing another example of the structure of the semiconductor integrated circuit using the intermediate potential according to the prior art.

FIG. 17 is a circuit diagram showing the structure of a reference voltage generating circuit according to the prior art which has been described in Japanese Patent Laying Open Gazette No. 5-114291, for example. The reference voltage generating circuit according to the prior art has a reference voltage source 1b and a reference voltage wiring driving circuit 2b, and supplies a reference voltage to an internal step-down circuit 4b by a reference voltage wiring 3b. The reference voltage source 1l generates an internal step-down potential Vref0 (=3.3 V).

Figure 18:
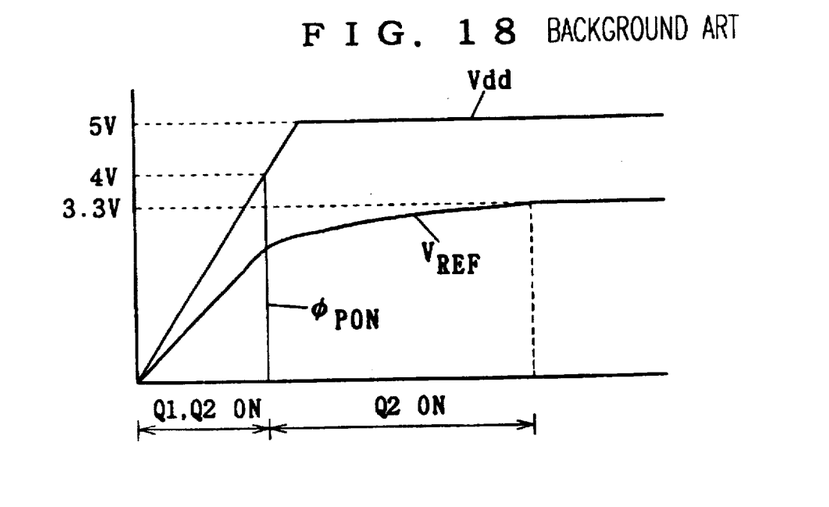
FIG. 18 is a waveform chart for explaining the operation of the semiconductor integrated circuit shown in FIG. 17.

FIG. 18 is a waveform chart for a signal of each portion for explaining the operation of the reference voltage generating circuit shown in FIG. 17 which has been described in Japanese Patent Laying Open Gazette No. 5-114291. When a power source is turned on, transistors $Q_1$ and $Q_2$ shown in FIG. 17 are turned on so that a reference voltage $V_{REF}$ can be raised in a short time. As shown in FIG. 18, when the external source potential Vdd exceeds 4.0 V, the transistor $Q_1$ shown in FIG. 17 is turned off so that the reference voltage $V_{REF}$ is raised to 3.3 V by only the transistor $Q_2$ having the smaller current ability shown in FIG. 17.

The intermediate potential generating circuit according to the prior art has the above-mentioned structure. In the case where two intermediate potential generating circuits are used as shown in FIG. 13, the potential of the intermediate potential supply contact can be set to a predetermined intermediate potential more quickly than in the case where only the second intermediate potential generating circuit 4 having the smaller driving ability is used. However, the intermediate potential generating circuit 3 generates a voltage which is lower than a difference between the source potential and the ground potential, that is, half of the source potential VCC. For this reason, the source potential VCC needs a very long time (which is twice as much as the time to reach the intermediate potential or more) in order for the potential of the intermediate potential supply contact to reach a predetermined intermediate potential as shown in FIG. 16.

The reference voltage generating circuit according to the prior art shown in FIG. 17 has a structure in which the transistor $Q_1$ is driven by a differential amplifier 21, and is turned off before the reference voltage $V_{REF}$ reaches 3.3 V when the source voltage Vdd exceeds a predetermined voltage of 3.3 V, that is, it reaches 4 V, and the reference voltage $V_{REF}$ is then raised to 3.3 V by the transistor $Q_2$ having the smaller driving ability.

Since the reference voltage $V_{REF}$ is raised to 3.3 V by only the transistor $Q_2$ having the smaller driving ability, a very long period is required until the reference voltage $V_{REF}$ reaches 3.3 V after the source voltage Vdd exceeds 3.3 V.

The semiconductor integrated circuit according to the prior art includes the intermediate potential generating circuit 3 having the greater driving ability shown in FIG. 14, the power on detecting circuit 1 shown in FIG. 13, the differential amplifier 21 shown in FIG. 17, and a circuit for generating a signal $\phi_{PON}$ which is not shown in FIG. 17. Such a circuit structure is complicated so that the layout area is increased.

SUMMARY OF THE INVENTION

A first aspect of the present invention is directed to a semiconductor integrated circuit comprising an intermediate potential generating circuit for generating an intermediate potential between a source potential and a ground potential to apply the intermediate potential to a predetermined node having a capacitance with the ground potential, at least one P channel MOS transistor having a source to which the source potential is applied, a drain connected to the predetermined node, and a gate, and a reset signal generating circuit for applying the ground potential to the gate of the at least one P channel MOS transistor until the source potential reaches the intermediate potential after a power source is turned on, and for applying the source potential to the gate of the at least one P channel MOS transistor so as to turn off the at least one P channel MOS transistor after the source potential reaches the intermediate potential.

A second aspect of the present invention is directed to a semiconductor integrated circuit comprising an intermediate potential generating circuit for generating an intermediate potential between a source potential and a ground potential to apply the intermediate potential to a predetermined node having a capacitance with the ground potential, at least one P channel MOS transistor having a source to which the source potential is applied, a drain connected to the predetermined node, and a gate, and a reset signal generating circuit for applying the ground potential to the gate of the at least one P channel MOS transistor until the potential of the predetermined node reaches the intermediate potential after a power source is turned on, and for applying the source potential to the gate of the at least one P channel MOS transistor so as to turn off the at least one P channel MOS transistor after the potential of the predetermined node reaches the intermediate potential.

A third aspect of the present invention is directed to the semiconductor integrated circuit according to the first or second aspect of the present invention wherein the predetermined node includes a wire, the at least one P channel MOS transistor includes a plurality of P channel MOS transistors, and the plurality of P channel MOS transistors are dispersed and connected all over the wiring if a capacitive load is distributed all over the wire.

A fourth aspect of the present invention is directed to a semiconductor integrated circuit comprising a predetermined node having a capacity with a ground potential, an intermediate potential generating portion for generating a first intermediate potential between the ground potential and a source potential, and a current mirror circuit portion which is connected between the predetermined node and the intermediate potential generating portion, is formed in such a manner that an output current can be turned on and off by ORing of a control signal and a power on reset signal, and amplifies a current which should be supplied to the predetermined node to apply the second intermediate potential to the predetermined node based on the first intermediate potential received from the intermediate potential generating portion, wherein the power on reset signal is changed to a level at which the current mirror circuit portion is turned off when the potential of the predetermined node almost reaches the second intermediate potential after a power source is turned on.

According to the first aspect of the present invention, the second ground potential is given to the gate of the P channel MOS transistor until the source potential reaches the intermediate potential after the power source is turned on. Consequently, the potential of the predetermined node is raised by the P channel MOS transistor in almost the same manner as the source potential. When the P channel MOS transistor is turned off by the reset signal generating circuit, the potential of the predetermined node is set to the intermediate potential. Consequently, the potential of the predetermined node which should supply the intermediate potential can be set to an objective intermediate potential immediately after the power source is turned on. Furthermore, only the P channel MOS transistor should be added besides the reset signal generating circuit. Thus, the layout area is reduced so that the integration of the semiconductor integrated circuit can be enhanced.

According to the second aspect of the present invention, the ground potential is given to the gate of the P channel MOS transistor until the potential of the predetermined node reaches the intermediate potential after the power source is turned on. Consequently, the potential of the predetermined node is raised by the P channel MOS transistor in almost the same manner as the source potential. When the P channel MOS transistor is turned off by the reset signal generating circuit, the potential of the predetermined node is set to the intermediate potential. Consequently, the potential of the predetermined node which should supply the intermediate potential can be set to an objective intermediate potential immediately after the power source is turned on. Furthermore, only the P channel MOS transistor should be added besides the reset signal generating circuit. Thus, the layout area is reduced so that the integration of the semiconductor integrated circuit can be enhanced.

According to the third aspect of the present invention, the charges are supplied by the P channel MOS transistors which are dispersed and connected to the wiring. Consequently, the whole wiring can be set to the predetermined intermediate potential almost uniformly.

According to the fourth aspect of the present invention, the current mirror circuit portion supplies the charges to the predetermined node by the power on reset signal until the potential of the predetermined node almost reaches the second intermediate potential when the power source is turned on. Consequently, the potential of the predetermined node can be set to the second intermediate potential before the current mirror circuit portion is controlled by the control signal. Thus, the accurate operation can be performed immediately after the power source is turned on while driving the predetermined node with low consumed power and great driving force.

In order to solve the above-mentioned problems, it is an object of the present invention to provide a semiconductor integrated circuit having a small layout area in which the potential of a node that should supply an intermediate potential can be set to an objective intermediate potential immediately after a power source is turned on.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
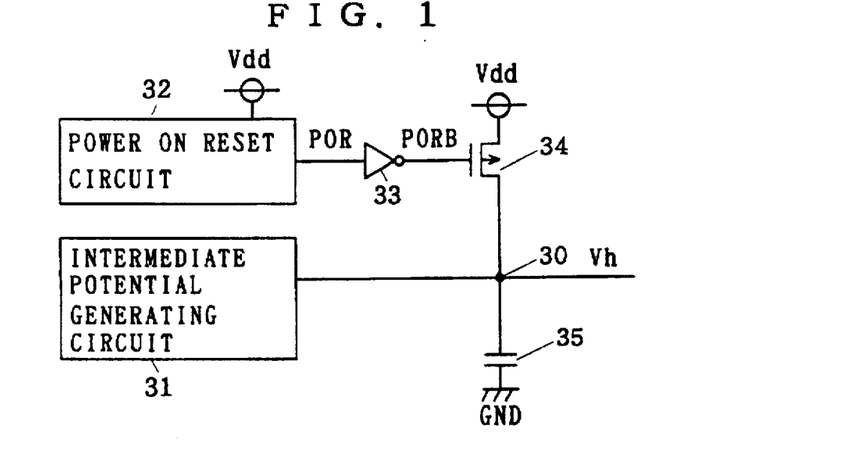
FIG. 1 is a block diagram showing a part of the structure of a semiconductor integrated circuit according to a first embodiment of the present invention.

A semiconductor integrated circuit according to a first embodiment of the present invention will be described below with reference to FIGS. 1 to 4. FIG. 1 is a block diagram showing a part of the structure of a semiconductor integrated circuit according to the first embodiment of the present invention. In FIG. 1, the reference numeral 30 designates a node whose potential should be set to an intermediate potential that is provided in the semiconductor integrated circuit, the reference numeral 31 designates an intermediate potential generating circuit for usually keeping the potential of the node 30 at a predetermined intermediate potential, the reference numeral 32 designates a power on reset circuit for changing a power on reset signal POR when a source potential Vdd reaches the predetermined intermediate potential, the reference numeral 33 designates an inverter having a CMOS structure which outputs an inverted signal PORB on receipt of the power on reset signal POR, the reference numeral 34 designates a P channel MOS transistor having a source to which the source potential Vdd is given, a drain connected to the node 30, and a gate for receiving the inverted signal PORB from the inverter 33, and the reference numeral 35 designates a capacitance between the node 30 and a ground potential GND.

The intermediate potential generating circuit 31 is of a low consumed power type, and has a lower driving ability and a very high output impedance. The power on reset circuit 32 and the inverter 33 form a reset signal generating circuit.

Figure 2:
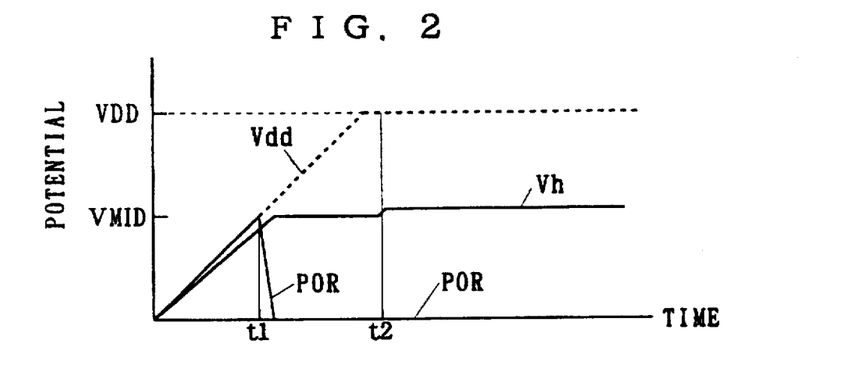
FIG. 2 is a waveform chart for explaining the operation of the semiconductor integrated circuit shown in FIG. 1.

FIG. 2 is a waveform chart showing the operation of the circuit in FIG. 1. As shown in FIG. 2, when the operation of a power source is started, the power on reset signal POR rises with almost the same gradient as that of an increase in the power potential Vdd (the change of a potential/a time).

The inverter 33 has a CMOS structure, and keeps an output thereof at a low level until the source potential Vdd exceeds the threshold voltage of a P channel MOS transistor forming the inverter 33. The power on reset signal POR has almost the same value as that of the source potential Vdd until a predetermined intermediate potential VMID is reached. For this reason, the inverter 33 outputs a low level as the inverted signal PORB until the predetermined intermediate potential VMID is reached. The P channel MOS transistor 34 is conductive while the inverted signal PORB has the low level. If the driving ability of the transistor 34 is sufficiently great, a potential Vh of the node 30 is increased almost with a rise in the source potential Vdd.

When a predetermined time t1 passes and the source potential Vdd reaches the predetermined intermediate potential VMID, the power on reset circuit 32 detects that the source potential Vdd is equal to the intermediate potential VMID. The power on reset circuit 32 changes the power on reset signal POR from the value of the source potential Vdd to a low level (the value of the ground potential GND). With this change, the inverter 33 changes the output thereof to a potential having almost the same value as that of the source potential Vdd. The P channel MOS transistor 34 whose gate receives the output of the inverter 33 becomes non-conductive so that the supply of charges to the node 30 is stopped. For this reason, the potential Vh of the node 30 becomes almost equal to the predetermined intermediate potential VMID. Since the intermediate potential generating circuit 31 has a very high output impedance, a current which flows from the node 30 to the intermediate potential generating circuit 31 is very small. After the transistor 34 is turned off, the potential Vh of the node 30 is almost kept at the predetermined intermediate potential VMID.

At a time t2 immediately after the source potential Vdd reaches the predetermined potential VDD, the intermediate potential generating circuit 31 outputs an accurate intermediate potential VMID. At this time, the potential Vh of the node 30 is almost equal to the predetermined intermediate potential VMID. Consequently, the potential Vh of the node 30 is immediately set to the accurate intermediate potential VMID by the intermediate potential generating circuit 31.

When the power source is turned on, the P channel MOS transistor 34 is directly controlled by the signal PORB which is obtained by inverting the power on reset signal POR so that the node 30 is directly driven by the power source through the transistor 34. Consequently, the potential of the node 30 can be set to an objective intermediate potential VMID in a very short time as compared with the cases where the node 30 is driven by only the intermediate potential generating circuit and where the transistor is controlled by the differential amplifier.

Furthermore, only the inverter 33 and P channel MOS transistor 34 should be added besides the power on reset circuit 32. Therefore, the layout area is hardly increased.

Figure 3:
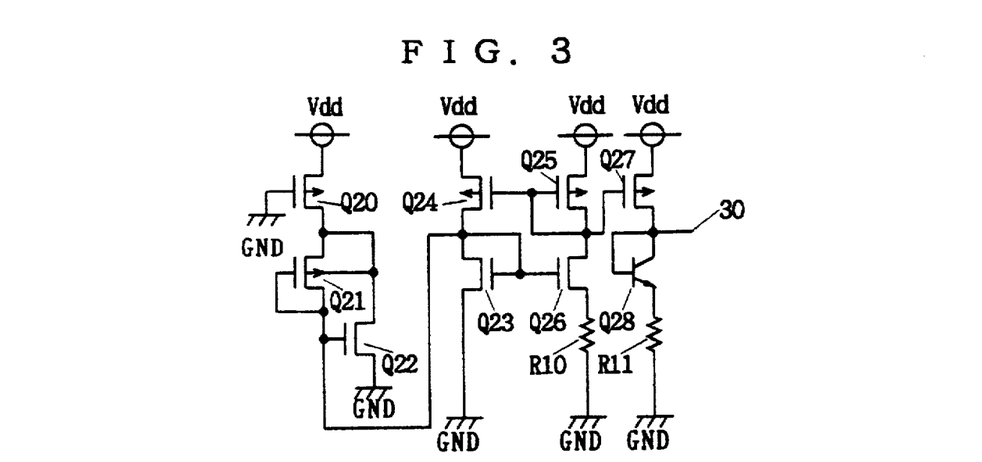
FIG. 3 is a circuit diagram showing an example of the structure of an intermediate potential generating circuit shown in FIG. 1.

FIG. 3 shows an example of the structure of the intermediate potential generating circuit 31.

The intermediate potential generating circuit shown in FIG. 3 includes a P channel MOS transistor Q20 having a drain, a source to which a source potential Vdd is given, and a gate to which a ground potential GND is given, a P channel MOS transistor Q21 having a gate, a drain, a source connected to the drain of the transistor Q20, and a substrate connected to the drain of the transistor Q20, an N channel MOS transistor Q22 having a drain connected to the source of the transistor Q21, a gate connected to the gate and drain of the transistor Q21, and a source to which the ground potential GND is given, an N channel MOS transistor Q23 having a source to which the ground potential GND is given, a gate connected to the gate of the transistor Q22, and a drain connected to the gate of the transistor Q22, a P channel MOS transistor Q24 having a gate, a source to which the source potential Vdd is given, and a drain connected to the drain of the transistor Q23, a P channel MOS transistor Q25 having a source to which the source potential Vdd is given, a gate connected to the gate of the transistor Q24, and a drain connected to the gate of the transistor Q24, an N channel MOS transistor Q26 having a source, a gate connected to the gate of the transistor Q23, and a drain connected to the drain of the transistor Q25, a resistor R10 having a first end connected to the source of the transistor Q26 and a second end to which the ground potential GND is given, a P channel MOS transistor Q27 having a source to which the source potential Vdd is given, a gate connected to the drain of the transistor Q25, and a drain connected to the node 30, an NPN transistor Q28 having an emitter, a collector connected to the drain of the transistor Q27, and a base connected to the drain of the transistor Q27, and a resistor R11 having a first end connected to the emitter of the transistor Q28 and a second end to which the ground potential GND is given.

The transistors Q27 and Q28 and the resistor R11 connected in series and respectively between the source potential Vdd and the ground potential GND. For this reason, the node 30 generates a potential Vh which is higher than the ground potential GND by voltages generated by the transistor Q28 and the resistor R11.

Figure 4:
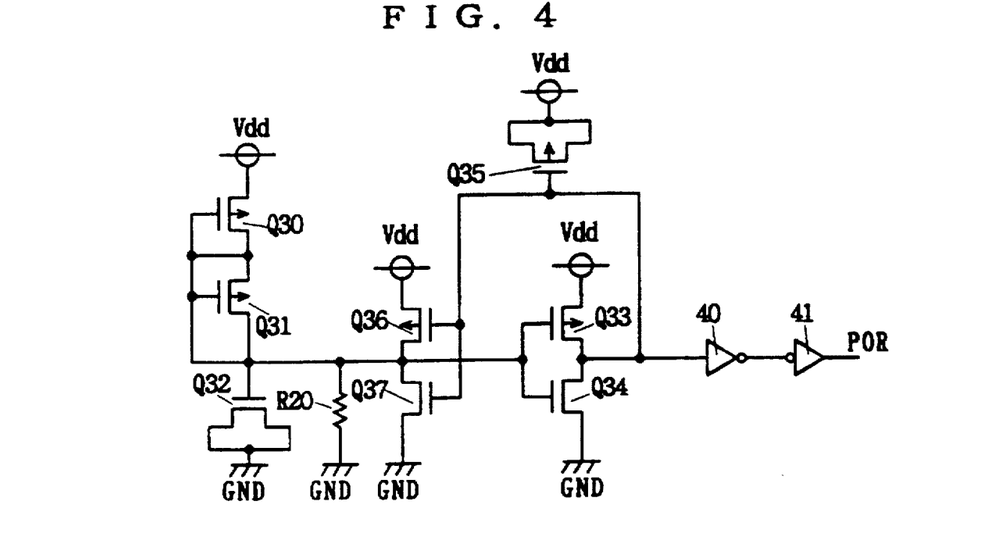
FIG. 4 is a circuit diagram showing an example of the structure of a power on reset circuit shown in FIG. 1.

FIG. 4 shows an example of the structure of the power on reset circuit 32. The power on reset circuit shown in FIG. 4 includes a P channel MOS transistor Q30 having a gate, a drain, and a source to which a source potential Vdd is given, a P channel MOS transistor Q31 having a source connected to the drain of the transistor Q30, a gate connected to the drain of the transistor Q30, and a drain connected to the drain of the transistor Q30, an N channel MOS transistor Q32 having a gate connected to the drain of the transistor Q30, a source to which a ground potential GND is given, and a drain to which the ground potential GND is given, a resistor R20 having a first end connected to the gate of the transistor Q32 and a second end to which the ground potential GND is given, a P channel MOS transistor Q33 having a drain, a source to which the source potential Vdd is given, and a gate connected to the first end of the resistor R20, an N channel MOS transistor Q34 having a drain connected to the drain of the transistor Q33, a source to which the ground potential GND is given, and a gate connected to the first end of the resistor R20, a P channel MOS transistor Q35 having a gate connected to the drain of the transistor Q34, a drain to which the source potential Vdd is given, and a source to which the source potential Vdd is given, a P channel MOS transistor Q36 having a gate connected to the gate of the transistor Q35, a source to which the source potential Vdd is given, and a drain connected to the gate of the transistor Q34, an N channel MOS transistor Q37 having a drain connected to the drain of the transistor Q36, a gate connected to the gate of the transistor Q36, and a source to which the ground potential GND is given, an inverter 40 having a CMOS structure which is provided with an output end and an input end connected to the drains of the transistors Q33 and Q34, and to which the source potential Vdd and the ground potential GND are given for operation, and an inverter 41 having a CMOS structure which is provided with an output end for outputting a power on reset signal POR and an input end connected to the output end of the inverter 40, and to which the source potential Vdd and the ground potential GND are given for operation.

The drain of the transistor Q30 is connected to the gate of the transistor Q34. By adjusting the threshold voltage at which the transistor Q34 is turned on and the resistance values of the transistor C)30 and the resistor R20, the potential which changes the power on reset signal POR can be set optionally. By using this fact, the potential which changes the power on reset signal POR is set to the predetermined intermediate potential VMID.

When the power source is turned on in the state set as described above, the transistor Q34 is turned on when the source potential Vdd reaches the intermediate potential VMID. Consequently, the power on reset signal POR output from the inverter 41 is changed to a low level. At the same time, the transistor Q36 is turned on so that the gates of the transistors Q33 and Q34 are fixed to a high level. The transistor Q31 does not operate in the state shown in FIG. 4. However, when adjusting the potential at which the transistor Q34 is turned on, the gates of the transistors Q30 and Q31 can be separated.

Second Embodiment

Figure 5:
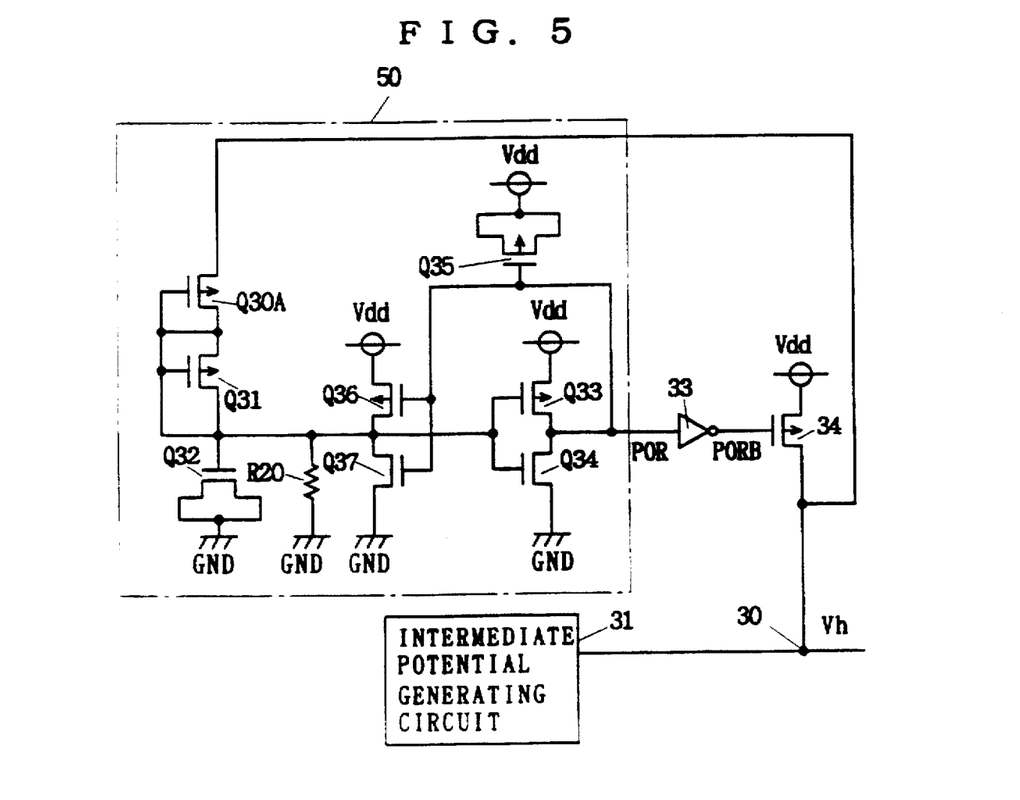
FIG. 5 is a block diagram showing a part of the structure of a semiconductor integrated circuit according to a second embodiment of the present invention.

A semiconductor integrated circuit according to a second embodiment of the present invention will be described below with reference to FIG. 5. FIG. 5 is a block diagram showing a part of the structure of the semiconductor integrated circuit according to the second embodiment of the present invention. In FIG. 5, the reference numeral 50 designates a signal generating circuit for outputting a signal POR which determines a timing for turning off a transistor Q34, and the same reference numerals designate the same portions as in FIG. 1.

The signal generating circuit 50 is different from the power on reset circuit shown in FIG. 4 in that a P channel MOS transistor Q30A is used in place of the transistor Q30 and the drains of transistors Q33 and Q34 are directly connected to an inverter 33. The signal generating circuit 50 and the inverter 33 form a reset signal generating circuit.

The sources of the transistors Q30A and Q30 are connected to different nodes. The source potential Vdd is given to the source of the transistor Q30 and a potential Vh of a node 30 is given to the source of the transistor Q30A.

The signal POR output from the signal generating circuit 50 is inverted when the potential Vh of the node 30 reaches a predetermined intermediate potential VMID. Accordingly, the signal POR output from the signal generating circuit 50 is almost the same as the power on reset signal POR shown in FIGS. 1 and 2. However, the signal generating circuit 50 directly detects the potential Vh of the node 30. Consequently, the accuracy of a timing at which the signal POR output from the signal generating circuit 50 is inverted is increased more than in the case where the power on reset circuit 32 is used.

The operation of the semiconductor integrated circuit described above is almost the same as that of the semiconductor integrated circuit according to the first embodiment described with reference to FIG. 4.

Third Embodiment

Figure 6:
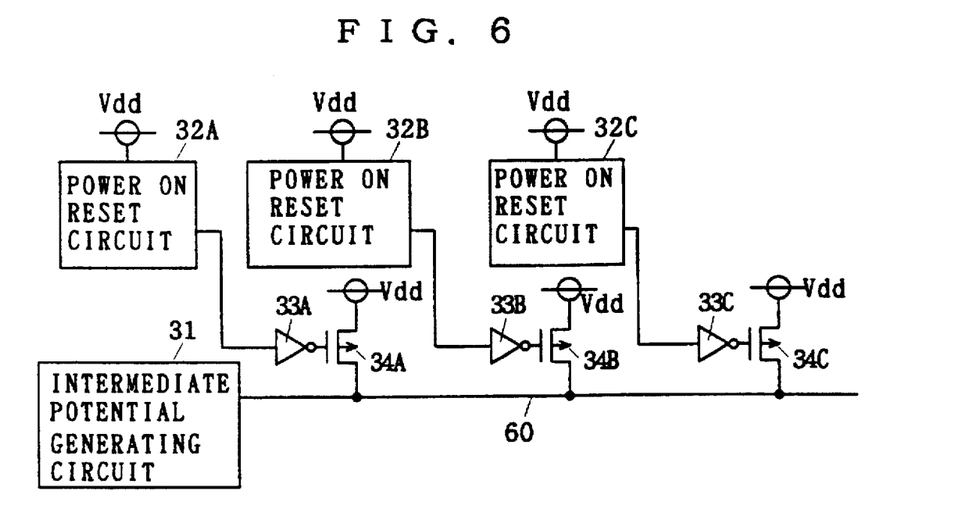
FIG. 6 is a block diagram showing a part of the structure of a semiconductor integrated circuit according to a third embodiment of the present invention.

A semiconductor integrated circuit according to a third embodiment of the present invention will be described below with reference to FIG. 6. FIG. 6 is a block diagram showing a part of the structure of the semiconductor integrated circuit according to the third embodiment of the present invention. In FIG. 6, the reference numeral 60 designates a wire corresponding to the node 30 shown in FIG. 1 which has comparatively large capacitance distributed, for example, a connection to the gates of a lot of transistors provided apart from one another or a very long connection. The structure obtained by a power on reset circuit 32A, an inverter 33A and a P channel MOS transistor 34A shown in FIG. 6 corresponds to the structure obtained by the power on reset circuit 32, the inverter 33 and the P channel MOS transistor 34 shown in FIG. 1. In addition, the structure obtained by a power on reset circuit 32B, an inverter 33B and a P channel MOS transistor 34B and the structure obtained by a power on reset circuit 32C, an inverter 33C and a P channel MOS transistor 34C are also the same as in FIG. 1.

As shown in FIG. 6, three circuits which comprise the power on reset circuits 32A to 32C, the inverters 33A to 33C and the P channel MOS transistors 34A to 34C are dispersively arranged on the wire 60.

By such a connection, also in the case where the wire 60 is arranged in two or three dimensions and capacitance components are distributed, any point on the wire 60 can be uniformly set to a predetermined intermediate potential at almost the same time and with a smaller error made depending on places.

While the power on reset circuits 32A to 32C have been used in the third embodiment, the signal generating circuit 50 according to the second embodiment may be used so that the same effects as in the third embodiment can be obtained. The number of transistors arranged is set corresponding to the wiring capacitance.

Furthermore, the power on reset circuits 32A to 32C may be collected so that the same effects as in the above-mentioned embodiments can be obtained.

Fourth Embodiment

Figure 7:
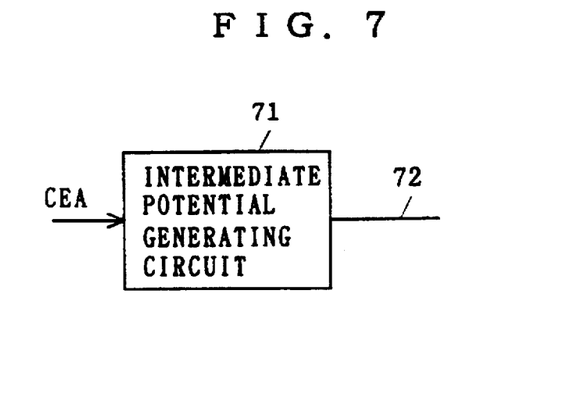
FIG. 7 is a block diagram for explaining a fourth embodiment of the present invention.

A semiconductor integrated circuit according to a fourth embodiment of the present invention will be described below with reference to FIGS. 7 to 9. FIG. 7 is a block diagram showing the structure of the semiconductor integrated circuit according to the fourth embodiment of the present invention. The circuit shown in FIG. 7 has a structure which is a premise of the fourth embodiment according to the present invention.

In FIG. 7, the reference numeral 71 designates an intermediate potential generating circuit having a structure in which a current mirror circuit portion is connected to the back step of an intermediate potential generating portion of a low consumed power type so that the driving ability can be increased and an output can be controlled by a control signal CEA sent from the outside.

Figure 9:
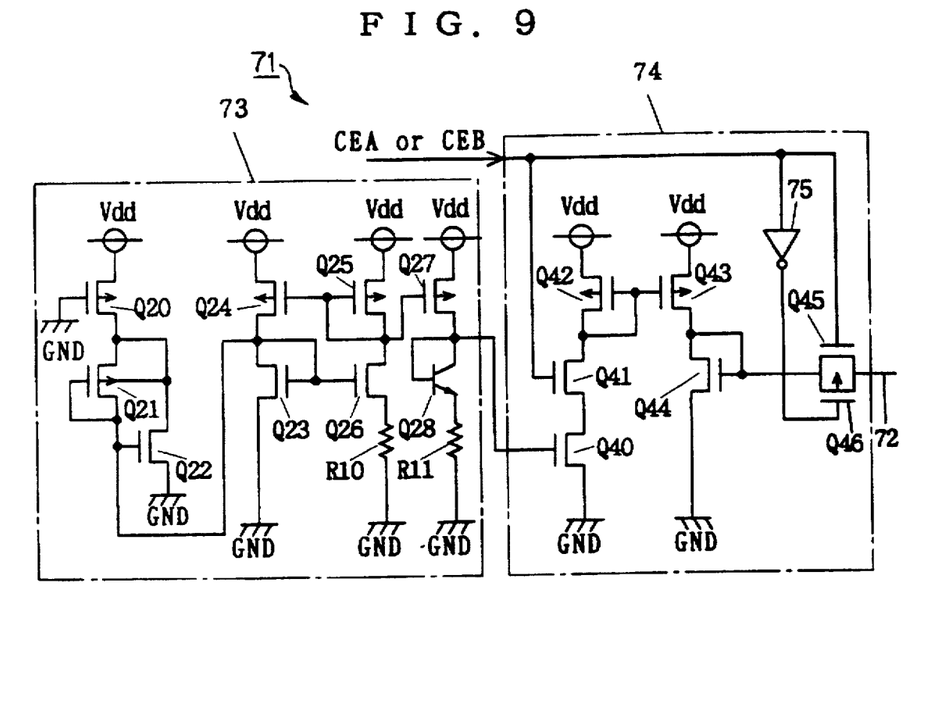
FIG. 9 is a circuit diagram showing an example of the structures of intermediate potential generating circuits shown in FIGS. 7 and 8.

FIG. 9 is a circuit diagram showing an example of the structure of the intermediate potential generating circuit 71 in FIG. 7. In FIG. 9, the reference numeral 73 designates an intermediate potential generating portion of a low consumed power type having the same structure as in FIG. 3, and the reference numeral 74 designates a current mirror circuit portion for outputting an intermediate potential Vh in response to an intermediate potential output from the intermediate potential generating portion 73.

If it is not necessary to apply an intermediate potential VMID with an increase in the driving ability, the control signal CEA causes the current mirror circuit portion 74 to be non-operative. Thus, the consumed power can be saved. The current mirror circuit portion 74 includes an N channel MOS transistor Q40 having a drain, a gate connected to the drain of a transistor Q27, and a source to which a ground potential GND is given, an N channel MOS transistor Q41 having a drain, a gate to which the control signal CEA is sent, and a source connected to the drain of the transistor Q40, a P channel MOS transistor Q42 having a source to which a source potential Vdd is given, a drain connected to the drain of the transistor Q41, and a gate connected to the drain of the transistor Q41, a P channel MOS transistor Q43 having a drain, a gate connected to the gate of the transistor Q42, and a source to which the source potential Vdd is given, an N channel MOS transistor Q44 having a source to which the ground potential GND is given, a drain connected to the drain of the transistor Q43, and a gate connected to the drain of the transistor Q43, an N channel MOS transistor Q45 having a first current electrode connected to the drain of the transistor Q43, a second current electrode connected to a node 72, and a gate to which the control signal CEA is sent, a P channel MOS transistor Q46 having a gate, a first current electrode connected to the drain of the transistor Q43, and a second current electrode connected to the node 72, and an inverter 75 having an input end to which the control signal CEA is sent and an output end connected to the gate of the transistor Q46. The transistors Q45 and Q46 form a transmission gate.

Figure 10:
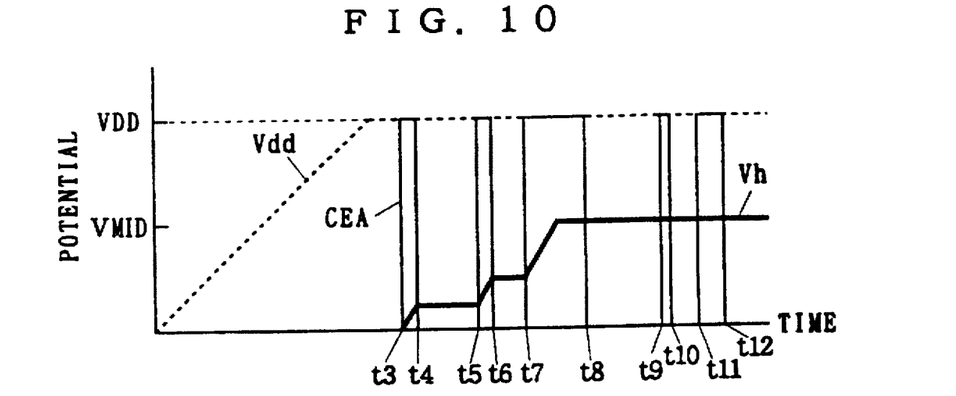
FIG. 10 is a waveform chart for explaining the operation of the semiconductor integrated circuit shown in FIG. 7.

FIG. 10 shows the operation of the circuit in FIG. 7.

The control signal CEA has a source potential VDD between times t3 and t4, between times t5 and t6, between times t7 and t8, between times t9 and t10, and between times t1 and t12, and has a ground potential GND (0 V potential) in other sections.

In the current mirror circuit portion 74, the transistors Q41, Q45 and Q46 are turned off while the control signal CEA has a low level (0 V potential). Consequently, charges are not supplied to the node 72. For this reason, a period for which the current mirror circuit portion 74 operates is too short between the times t3 and t4 so that the potential Vh of the node 72 cannot be set to the predetermined intermediate potential VMID. Similarly to a period between the times t3 and t4, the potential Vh of the node 72 cannot be set to the intermediate potential VMID between the times t5 and t6. The potential Vh finally reaches the intermediate potential VMID between the times t7 and t8.

As shown in FIG. 10, the current mirror circuit portion 74 having the great driving ability is controlled by the control signal CEA even though it is provided on the back step of the intermediate potential generating portion 73 of a low consumed power type. For this reason, the intermediate potential generating circuit 71 cannot set the potential Vh of the node 72 to the intermediate potential VMID at the initial operation stage.

Figure 8:
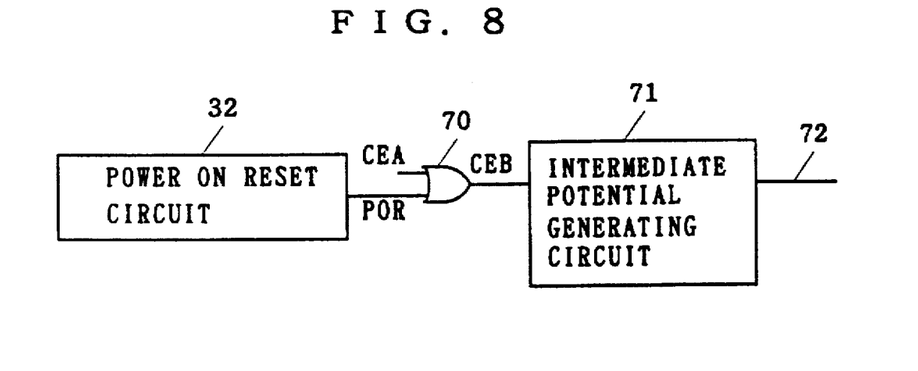
FIG. 8 is a block diagram showing a part of the structure of a semiconductor integrated circuit according to the fourth embodiment of the present invention.

FIG. 8 is a block diagram showing the structure of an intermediate potential generating circuit of a signal control type which is provided in the semiconductor integrated circuit and can set the potential Vh of the node 72 to the intermediate potential VMID at the initial operation stage immediately after a power source is turned on. In FIG. 8, the reference numeral 32 designates a power on reset circuit for outputting a power on reset signal POR, the reference numeral 70 designates an OR gate which ORs the power on reset signal POR and the control signal CEA to output a control signal CEB, and the reference numeral 71 designates an intermediate potential generating circuit controlled by the control signal CEB.

The structure of the intermediate potential generating circuit 71 is the same as in FIG. 7. The intermediate potential generating circuits 71 shown in FIGS. 7 and 8 differ in that only the control signals sent thereto are different from each other. Furthermore, the power on reset circuit 32 can be formed in the same manner as in FIG. 4. It is preferable that the power on reset signal POR should be set to a ground potential when the potential of the node 72 reaches the predetermined intermediate potential VMID. The potential Vh of the node 72 or the source potential Vdd can give a timing at which the power on reset signal POR is changed. When using the source potential Vdd, the potential at which the power on reset signal POR is changed is set in accordance with the relationship between the source potential Vdd and the potential Vh of the node 72.

Figure 11:
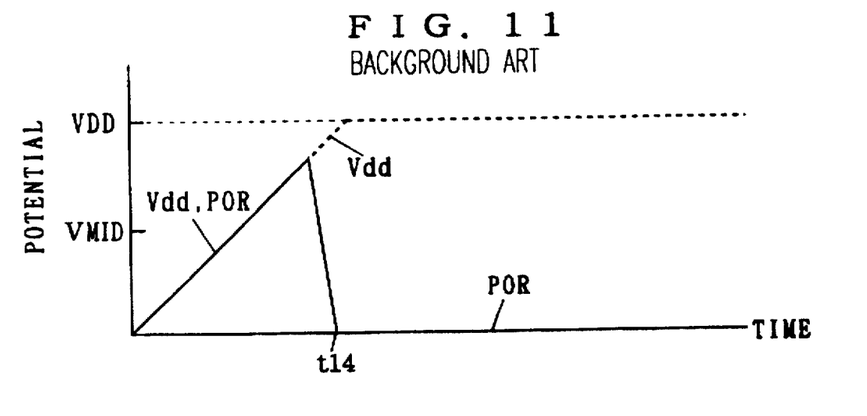
FIG. 11 is a waveform chart showing a power on reset signal shown in FIG. 8.
Figure 12:
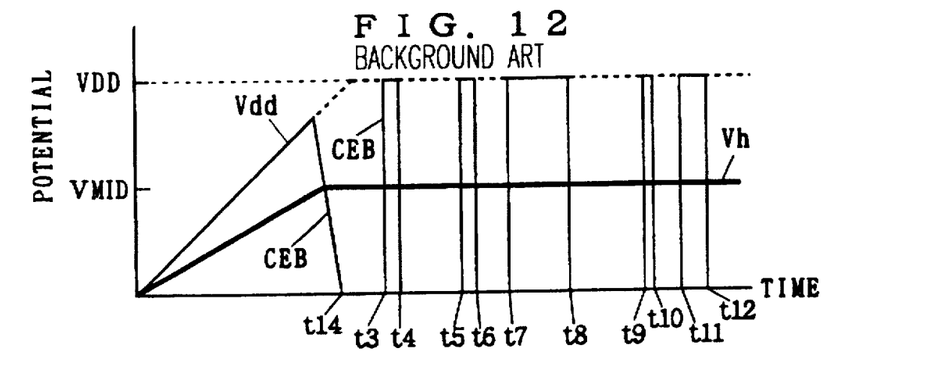
FIG. 12 is a waveform chart for explaining the operation of the intermediate potential generating circuit shown in FIG. 8.

FIG. 11 is a graph showing the relationship between the power on reset signal POR and the source potential Vdd. FIG. 12 is a graph showing the relationship between the potential Vh of the node 72 and the control signal CEB in the semiconductor integrated circuit of FIG. 8.

The control signal CEA shown in FIG. 10 is ORed with the power on reset signal POR shown in FIG. 11 so that the control signal CEB is generated as shown in FIG. 12. Consequently, the intermediate potential generating circuit 71 supplies charges to the node 72 from the time when the power source is turned on (origin) to the time 114. Therefore, the potential Vh of the node 72 is almost set to the intermediate potential VMID before the control signal CEA is activated. Thus, the accurate operation can also be obtained in the initial state for the semiconductor integrated circuit using the intermediate potential generating circuit 71.

After the power on reset signal POR is set to the low level, the current mirror circuit portion 74 becomes operative by the control signal CEA so as to keep the intermediate potential VMID if necessary. Consequently, the intermediate potential generating circuit 71 can simultaneously display the conflicting functions, that is, the great driving ability and the low consumed power.

While the power on reset circuit 32 has been used in the fourth embodiment, the signal generating circuit 50 described in the second embodiment may be used so that the same effects as in the above-mentioned embodiments can be obtained.

While the invention has been described in detail, the foregoing description is in all aspects illustrative and not restrictive. It is understood that numerous other modifications and variations can be devised without departing from the scope of the invention.

We claim:

1. A semiconductor integrated circuit comprising:

an intermediate potential generating circuit for generating an intermediate potential between a power supply potential and a ground potential to apply said intermediate potential to a predetermined node having a capacitance between the predetermined node and the ground potential;

at least one P channel MOS transistor having a source to which said power supply potential is applied, a drain connected to said predetermined node, and a gate; and a reset signal generating circuit for applying said ground potential to said gate of said at least one P channel MOS transistor until said power supply potential reaches said intermediate potential, and for applying said power supply potential to said gate of said at least one P channel MOS transistor so as to turn off said at least one P channel MOS transistor after said power supply potential reaches said intermediate potential.

2. The semiconductor integrated circuit as defined in claim 1, wherein said predetermined node includes a wire;

said at least one P channel MOS transistor includes a plurality of P channel MOS transistors; and said plurality of P channel MOS transistors are distributed over said wire.

3. The semiconductor integrated circuit as defined in claim 1, wherein said reset signal generating circuit includes a CMOS inverter which has an input end and an output end connected to said gate of said at least one P channel MOS transistor, and receives at its input end either said power supply potential or said ground potential, and a power on reset circuit for applying said power supply potential to said input end of said CMOS inverter until said power supply potential reaches said intermediate potential and for applying said ground potential to said input end of said CMOS inverter after said power supply potential exceeds said intermediate potential.

4. A semiconductor integrated circuit comprising:

an intermediate potential generating circuit for generating an intermediate potential between a power supply potential and a ground potential to apply said intermediate potential to a predetermined node having a capacitance between the predetermined node and the ground potential;

at least one P channel MOS transistor having a source to which said power supply potential is applied, a drain connected to said predetermined node, and a gate; and a reset signal generating circuit for applying said ground potential to said gate of said at least one P channel MOS transistor until said power supply potential reaches said intermediate potential, and for applying said power supply potential to said gate of said at least one P channel MOS transistor so as to turn off said at least one P channel MOS transistor after said potential of said predetermined node reaches said intermediate potential.

5. The semiconductor integrated circuit as defined in claim 4, wherein said predetermined node includes a wire;

said at least one P channel MOS transistor includes a plurality of P channel MOS transistors; and said plurality of P channel MOS transistors are distributed over said wire.

6. The semiconductor integrated circuit as defined in claim 4, wherein said reset signal generating circuit includes a CMOS inverter which has an input end and an output end connected to said gate of said at least one P channel MOS transistor, and receives at its input end either said power supply or said ground potential, and a signal generating circuit for applying said power supply potential to said input end of said CMOS inverter until said potential of said predetermined node reaches said intermediate potential and for applying said ground potential to said input end of said CMOS inverter after said potential of said predetermined node exceeds said intermediate potential.

7. A semiconductor integrated circuit comprising:

a predetermined node having a capacitance between the predetermined node and a ground potential;

an intermediate potential generating portion for generating a first intermediate potential between said ground potential and a power supply potential; and a current mirror circuit portion connected between said predetermined node and said intermediate potential generating portion, and formed in such a manner that an output current can be turned on and off by ORing of a control signal and a power on reset signal, and which amplifies a current which is supplied to said predetermined node to apply a second intermediate potential received from said intermediate potential generating portion;

wherein said power on reset signal is changed to a level at which said current mirror circuit portion is turned off when the potential of said predetermined node reaches said second intermediate potential.

8. The semiconductor integrated circuit as defined in claim 7, wherein said current mirror circuit portion includes a first N channel MOS transistor having a gate which receives said first intermediate potential from said intermediate potential generating portion, a source to which said ground potential is given, and a drain;

- a second N channel MOS transistor having a source connected to said drain of said first N channel MOS transistor, a gate to which a logic OR function of said control signal and said power on reset signal is given, and a drain;
- a first P channel MOS transistor having a source to which said power supply potential is given, a drain connected to said drain of said second N channel MOS transistor, and a gate connected to said drain of said second N channel MOS transistor;
- a second P channel MOS transistor having a source to which said power supply potential is given, a gate connected to said gate of said first P channel MOS transistor, and a drain;
- a third N channel MOS transistor having a source to which said ground potential is given, a gate connected to said drain of said second P channel MOS transistor, and a drain connected to said drain of said second P channel MOS transistor; and transfer gates which are connected between said predetermined node and said drain of said second P channel MOS transistor and controlled by said logic OR function of said control signal and said power on reset signal.

* * * * *